United States Patent
Zhang et al.

(10) Patent No.: US 7,480,361 B1
(45) Date of Patent: Jan. 20, 2009

(54) PHASE LOCK DETECTOR

(75) Inventors: Qi Zhang, Milpitas, CA (US); Atul Ghia, San Jose, CA (US)

(73) Assignee: Xilinx, Inc., San Jose, CA (US)

( * ) Notice: Subject to any disclaimer, the term of this patent is extended or adjusted under 35 U.S.C. 154(b) by 663 days.

(21) Appl. No.: 10/889,553

(22) Filed: Jul. 12, 2004

(51) Int. Cl.
*H03D 3/24* (2006.01)

(52) U.S. Cl. .................................................. 375/376

(58) Field of Classification Search ............... 375/354, 375/357, 369, 372, 373, 374, 376; 370/395.62, 370/507; 455/265; 702/89; 713/375, 400
See application file for complete search history.

(56) References Cited

U.S. PATENT DOCUMENTS

| | | | |
|---|---|---|---|
| 6,014,050 A | 1/2000 | McClure | |
| 6,289,068 B1 | 9/2001 | Hassoun et al. | |
| 6,316,987 B1 | 11/2001 | Dally et al. | |
| 6,356,141 B1 | 3/2002 | Yamauchi | |
| 6,400,176 B1 | 6/2002 | Griffin et al. | |
| 6,404,258 B2 | 6/2002 | Ooishi | |
| 6,466,058 B1 * | 10/2002 | Goldman | 327/49 |
| 6,476,656 B2 | 11/2002 | Dally et al. | |
| 6,496,554 B1 * | 12/2002 | Ahn | 375/376 |
| 6,515,503 B2 | 2/2003 | Griffin et al. | |
| 6,728,240 B1 | 4/2004 | Dally et al. | |
| 6,759,875 B2 | 7/2004 | Mano et al. | |
| 6,775,342 B1 | 8/2004 | Young et al. | |
| 6,897,696 B2 | 5/2005 | Chang | |
| 6,933,759 B1 | 8/2005 | Wu et al. | |
| 2002/0109495 A1 * | 8/2002 | Antone et al. | 324/76.54 |
| 2002/0175769 A1 * | 11/2002 | Wong et al. | 331/17 |
| 2005/0189974 A1 * | 9/2005 | Chao | 327/158 |

OTHER PUBLICATIONS

U.S. Appl. No. 10/889,248, filed Jul. 12, 2004, Zhang et al.
Lee, Ming-Ju Edward, "Low-Power Area-Efficient High-Speed I/O Circuit Techniques," IEEE Journal of Solid-State Circuits, Nov. 2000, pp. 1591-1599, vol. 35, No. 11.

* cited by examiner

*Primary Examiner*—Sam K Ahn
(74) *Attorney, Agent, or Firm*—W. Eric Webostad; Justin Liu

(57) ABSTRACT

Method and apparatus for phase lock detection is described. More particularly, a phase lock detection circuit (20) includes a synchronization circuit (23) coupled to receive a reference signal (31) and configured to provide a derivative signal (32). A phase lock detector (21) is coupled to receive the reference signal (31) and the derivative signal (32) and is configured to provide a cycle lock signal (24) indicating whether a phase lock exists within a lock window (57) for a clock cycle.

19 Claims, 5 Drawing Sheets

| | PHASE(FEEDBACK CLOCK − DELAY) > PHASE(REFERENCE CLOCK) 47 | PHASE(FEEDBACK CLOCK − DELAY) < PHASE(REFERENCE CLOCK) < PHASE(FEEDBACK CLOCK + DELAY) 48 | PHASE(FEEDBACK CLOCK + DELAY) < PHASE(REFERENCE CLOCK) 49 |
|---|---|---|---|
| LEAD/LAG 41 | LEAD | LAG | LAG |
| LEAD/LAG 42 | LEAD | LEAD | LAG |
| LOCK 44 | LOW | HIGH | LOW |

FIG. 4

PHASE LOCK DETECTOR

FIELD OF THE INVENTION

One or more aspects of the invention relate generally to phase lock detection, and more particularly, to avoiding erroneous out-of-lock signals.

BACKGROUND OF THE INVENTION

Delay-Locked Loops ("DLLs") and Phase-Locked Loops ("PLLs") are well-known examples of synchronization circuits which may be used for obtaining a lock to an externally provided signal, such as synchronizing an internal clock signal with an externally provided clock signal. However, a PLL may have jitter accumulation caused by phase noise inside the voltage-controlled oscillator of the PLL, and thus a DLL, which has no jitter accumulation, may be a preferable alternative over a PLL for digital Very-Large-Scale Integration ("VLSI") circuits.

However, input jitter of a clock signal or intrinsic DLL static offset may negatively impact performance of a lock detector of a DLL. For example, in a DLL there is no jitter accumulation, even when the DLL is out of lock, and thus a conventional lock detector may not be able to delineate between an actual out-of-lock condition and a false out of lock condition ("false alarm"). A false alarm may be caused by jitter or intrinsic static DLL offset or a combination thereof.

Accordingly, it would be desirable and useful to provide a lock detector that is less likely to produce a false alarm than a conventional lock detector.

SUMMARY OF THE INVENTION

An aspect of the invention is a phase lock detection circuit, comprising: a synchronization circuit coupled to receive a reference signal and configured to provide a derivative clock signal; the derivative clock signal being derived from the reference signal; a phase lock detector coupled to receive the reference signal and the derivative clock signal; the phase lock detector configured to provide a cycle lock signal; and the cycle lock signal indicating whether a phase lock exists as between the reference signal and the derivative clock signal within a lock window for a clock cycle.

Another aspect of the invention is a phase lock detector, comprising: a first delay coupled to receive a reference signal and configured to provide a delayed version of the reference signal; a second delay coupled to receive a feedback signal and configured to provide a delayed version of the feedback signal, the feedback signal being a version of the reference signal; a first phase detector coupled to receive the feedback signal and the delayed version of the reference signal; the first phase detector configured to compare phase of the feedback signal and the delayed version of the reference signal to provide a first phase relation signal; a second phase detector coupled to receive the delayed version of the feedback signal and the reference signal; the second phase detector configured to compare phase of the delayed version of the feedback signal and the reference signal to provide a second phase relation signal; and combinational logic coupled to receive the first phase relation signal and the second phase relation signal to provide a lock indicator signal, the lock indicator signal indicating whether the reference signal and the feedback signal are in a lock window.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

FIG. 4 is a table diagram depicting an exemplary embodiment of states of lead/lag signals and of an interim lock signal.

DETAILED DESCRIPTION OF THE DRAWINGS

Figure 1:
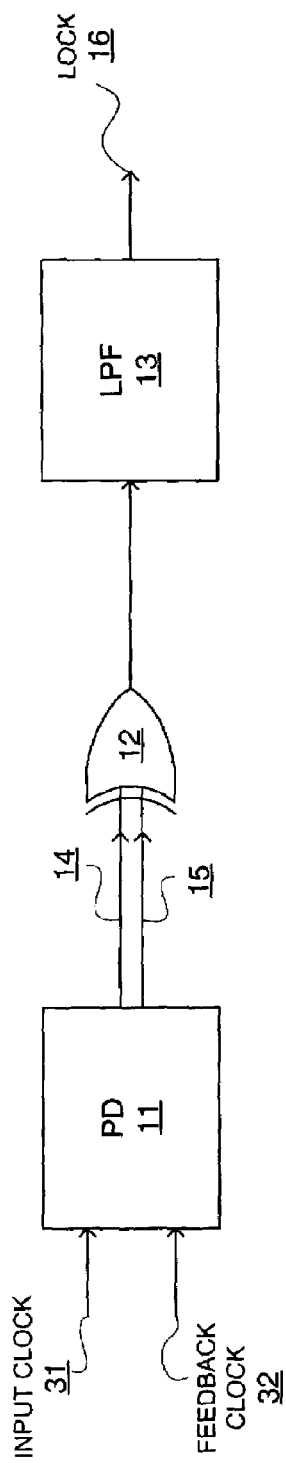
FIG. 1 is a block/schematic diagram depicting an exemplary embodiment of a conventional lock detector.

In order to more clearly understand the limitations of the prior art, there is shown in FIG. 1 a block/schematic diagram depicting an exemplary embodiment of a conventional lock detection circuit 10. An input clock signal 31 is provided to a synchronization circuit such as a Delay-Locked Loop ("DLL") (not shown in FIG. 1) to obtain feedback clock signal 32. Once a DLL is phase locked to an input, such as input clock 31, an output of such DLL, such as feedback clock signal 32, may be in-phase with input clock 31. Feedback clock signal 32 may for example be phase synchronous with input clock signal 31, except that feedback clock signal may be approximately one input clock cycle behind input clock signal 31.

Input clock signal 31 is input to phase comparator or phase detector ("PD") 11. Assuming input clock signal 31 and feedback clock signal 32 are in perfect phase alignment, PD outputs 14 and 15 provided as input to exclusive-OR ("XOR") gate 12 will have the same value. Accordingly, output of XOR gate 12 will be a logic low voltage indicating a lock condition. Output of XOR gate 12 is provided as input to low-pass filter ("LPF") 13 for filtering. Output of LPF 13 is lock signal 16.

However, if a DLL used to produce feedback clock signal 32 has an intrinsic static offset or there is jitter in input clock signal 31 or a combination thereof, then PD outputs 14 and 15 may be slightly out-of-phase with respect to one another. Accordingly, PD outputs 14 and 15 as input to XOR gate 12 may not have the same value. In which state, output of XOR gate will be a logic high voltage indicating an out-of-lock condition when filtered by LPF 13. For example, a phase timing difference of even as small as approximately 100 picoseconds or less may produce an erroneous out-of-lock indication via lock signal 16. In this condition, output of XOR gate 12 may change state ("flip") for each clock cycle of input clock signal 31. This may result in a false loss-of-lock indication via lock signal 16.

Figure 2:
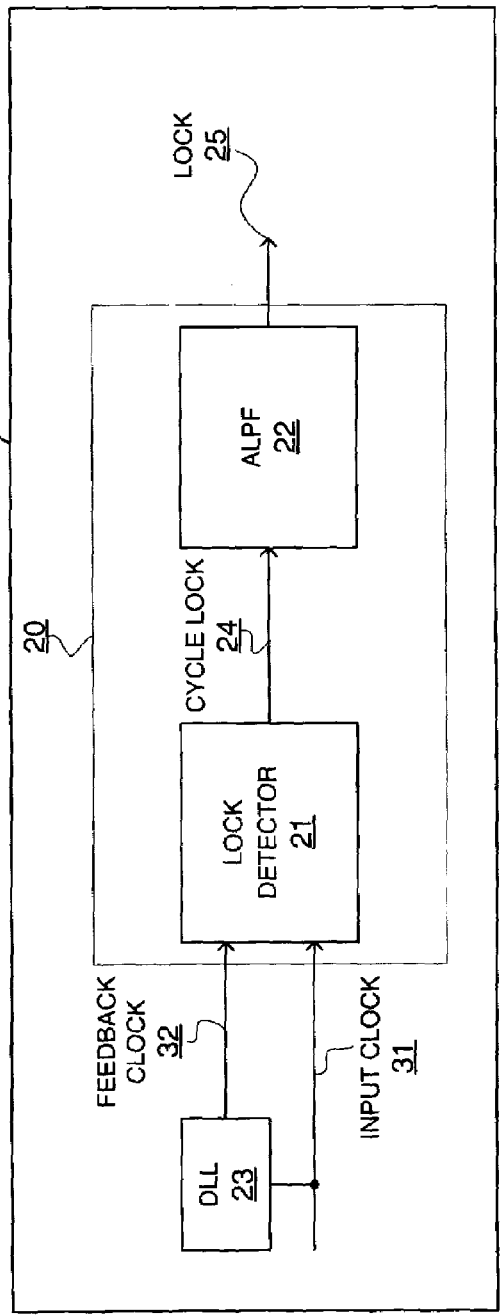
FIG. 2 is a block diagram depicting an exemplary embodiment of a lock detection circuit.

FIG. 2 is a block diagram depicting an exemplary embodiment of a lock detection circuit 20. Lock detection circuit 20 may be located in an integrated circuit 100. Integrated circuit 100 may be any of a variety of known integrated circuits, including without limitation a programmable logic device (PLD) such as a Field Programmable Gate Array ("FPGA"). For example, lock detection circuit 20 may be located in an Input/Output Block ("IOB") of an integrated circuit such as an FPGA. DLL 23 receives input clock signal 31, and provides at least an approximately synchronized version of input clock signal 31 as an output, namely, feedback clock signal 32 as previously described. Lock detection circuit 20 is more robust with respect to jitter of input clock signal 31 or intrinsic static offset of DLL 23 affecting feedback clock signal 32 or a combination thereof than lock detection circuit 10 of FIG. 1.

Lock detection circuit 20 includes lock detector 21 and asymmetrical low-pass filter ("ALPF") 22. Lock detector 21 is coupled to receive feedback clock signal 32 and input clock signal 31. Lock detector 21 is configured to indicate a lock condition on a per clock cycle basis of input clock signal 31. Lock detector 21 checks for a lock condition, or out-of-lock condition, for each clock cycle of input clock signal 31. The result of this check is provide as output from lock detector 21 as cycle lock signal 24.

Cycle lock signal 24 is provided as input to ALPF 22. ALPF 22 asymmetrically filters cycle lock signal 24 to provide an output. Output of ALPF signal 22 is lock signal 25.

Figure 3:
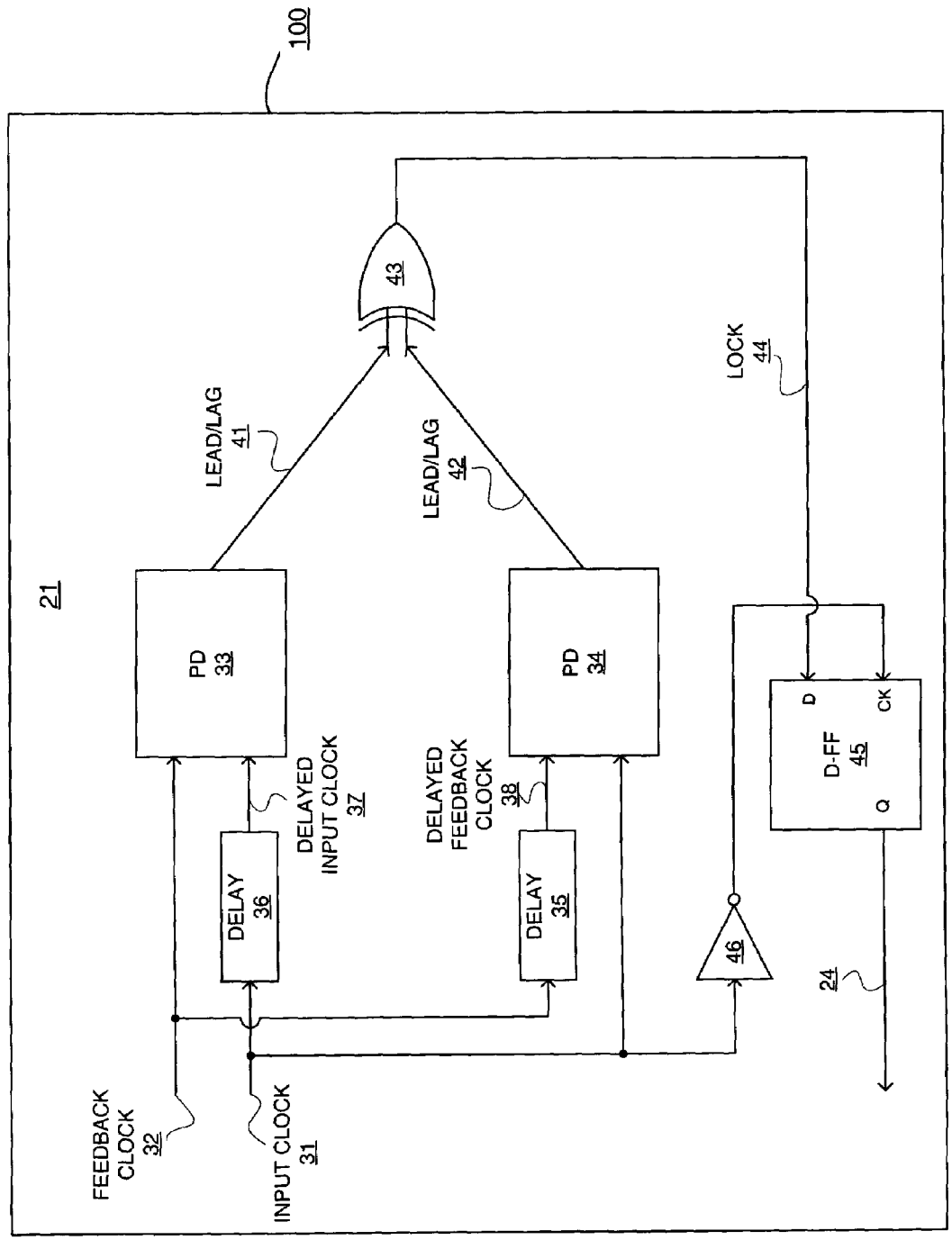
FIG. 3 is a block/schematic diagram depicting an exemplary embodiment of a lock detector.

FIG. 3 is a block/schematic diagram depicting an exemplary embodiment of lock detector 21. Lock detector 21 may be located in an integrated circuit 100. Integrated circuit 100 may be any of a variety of known integrated circuits, including without limitation an FPGA. For example, lock detector 21 may be located in an IOB of an FPGA. Feedback clock signal 32 is provided as input to phase detector 33 and to delay 35. Input clock 31 is provided as input to phase detector 34 and to delay 36. The output of a phase detector is a binary up or down signal, meaning the phase of an input being checked leads or lags a reference input. Delays 35 and 36 may be a series of delay elements known as a delay line. Delays 35 or 36 may be fixed delays to provide a fixed locking window or adjustable delays to provide an adjustable locking window. Additionally, delay provided by each of delays 34 and 35 may be at least approximately equal.

Input clock signal 31 is delayed by delay 36, the output of which is delayed input clock signal 37. Inputs to phase detector 33 are feedback clock signal 32 and delayed input clock signal 37. The output of phase detector 33 is lead/lag signal 41.

Feedback clock signal 32 is delayed by delay 35, the output of which is delayed feedback clock signal 38. Inputs to phase detector 34 are delayed feedback clock signal 38 and input clock signal 31. The output of phase detector 34 is lead/lag signal 42.

Lead/lag signals 41 and 42 are input to exclusive OR ("XOR") gate 43. The output of XOR gate is interim lock signal 44. Interim lock signal 44 is provided as a data input to a clocked data register, such as D flip-flop 45. Input clock signal 31 is provided as input to inverter 46, the output of which is an inverted version of input clock signal 31. Accordingly, output of inverter 46 is at least approximately 180 degrees out of phase with respect to input clock signal 31. This 180 degree phase lag provides sufficient setup time for interim lock signal 44 input to flip-flop 45. Output of flip-flop 45 is cycle lock signal 24. In other words, cycle lock signal 24 is interim lock signal 44 output responsive to a clock cycle of an inverted version of input clock signal 31. Notably, flip-flop 45 may be clocked either by input clock signal 31 or feedback clock signal 32.

For input clock signal 31 and delayed input clock signal 37 being reference signal inputs to phase detectors 34 and 33, respectively, if phase of a feedback clock signal leads phase of a reference clock signal, then a phase detector output will be logic high. If, however, phase of a feedback clock signal lags phase of a reference clock signal, then phase detector output will be logic low. Assuming, for example, delayed input clock signal 37 and delayed feedback clock signal 38 are each delayed by delta-T, where delta-T is 100 picoseconds, then a window of 200 picoseconds for a lock to occur is created. For example, if leading edges of a reference signal and a feedback clock signal input to a phase detector are both within the window, then interim lock signal 44 will indicate a lock condition. In other words, if a leading edge of feedback clock signal 32 is within a lock window of delay delta-T of delay 35 with respect to a leading edge of input clock signal 31, then a lock condition will be registered in flip-flop 45 for that clock cycle. Otherwise, an out-of-lock condition will be registered in flip-flop 45 for an input clock cycle.

Notably, delta-T may be selected at least in part to compensate for intrinsic static offset of a DLL. Thus, delay provided by delay 35 may be different than delay provided by delay 36 to compensate for an intrinsic static offset of a DLL.

FIG. 4 is a table diagram depicting an exemplary embodiment of states of lead/lag signals 41 and 42, and of interim lock signal 44. For state 47, phase of a feedback clock signal less a delay delta-T is greater than phase of a reference clock signal. Accordingly, lead/lag signals 41 and 42 will both indicate that feedback clock signal 32 leads reference clock signal 31 (i.e., both will be logic high), and interim lock signal 44 will indicate an out-of-lock condition (i.e., logic low).

For state 49, phase of a feedback clock signal plus a delay delta-T is less than phase of a reference clock signal. Accordingly, lead/lag signals 41 and 42 will both indicate that feedback clock signal 32 lags reference clock signal 31 (i.e., both will be logic low), and interim lock signal 44 will indicate an out-of-lock condition (i.e., logic low).

For state 48, phase of a feedback clock signal less a delay delta-T is less than phase of a reference clock signal which is less than phase of the feedback clock signal plus the delay delta-T. Accordingly, lead/lag signal 41 will indicate that the feedback clock signal lags the reference clock signal (i.e., logic low), and lead/lag signal 42 will indicate that the feedback clock signal leads the reference clock signal (i.e., logic high), and interim lock signal 44 will indicate a lock condition (i.e., logic high). In other words, a rising reference clock edge will be within plus or minus delta-T ("a lock window") of a rising feedback clock edge. Notably, though rising edges are used, phase detectors may operate on falling edges.

Figure 5A:
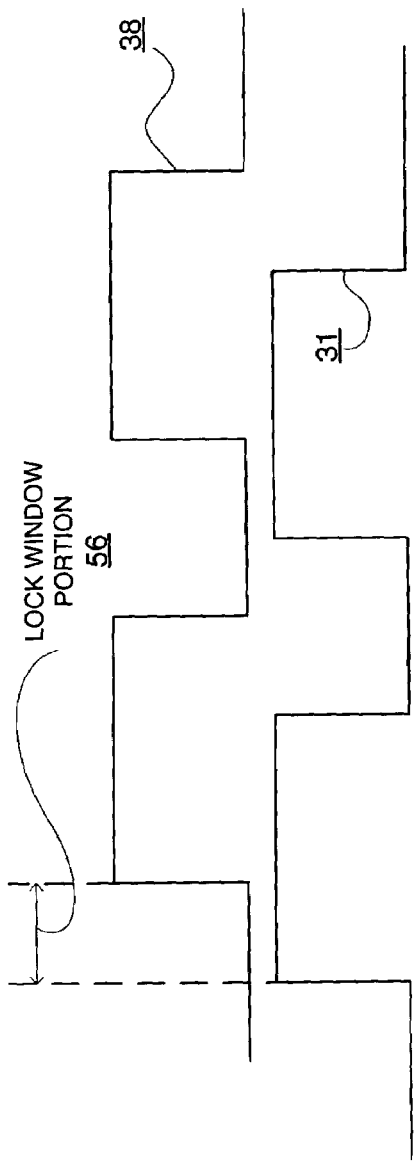
FIGS. 5A and 5B are a signal diagrams depicting exemplary embodiments of respective portions of detection window timing.
Figure 5B:
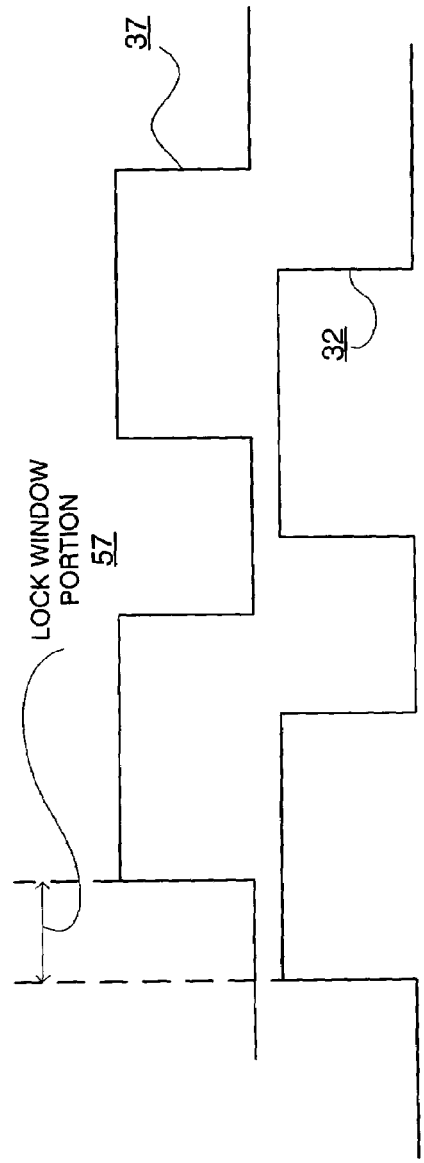

FIGS. 5A and 5B are a signal diagrams depicting exemplary embodiments of respective portions of detection window timing. Input clock signal 31 leads delayed feedback clock signal 38 by an amount of time 56, which is a portion of a lock window. Feedback clock signal 32 leads delayed input clock signal 37 by an amount of time 57, which is another portion of a lock window. The lock window is the sum of times 56 and 57. Notably, times 56 and 57 may, though need not, be equal.

Figure 6:
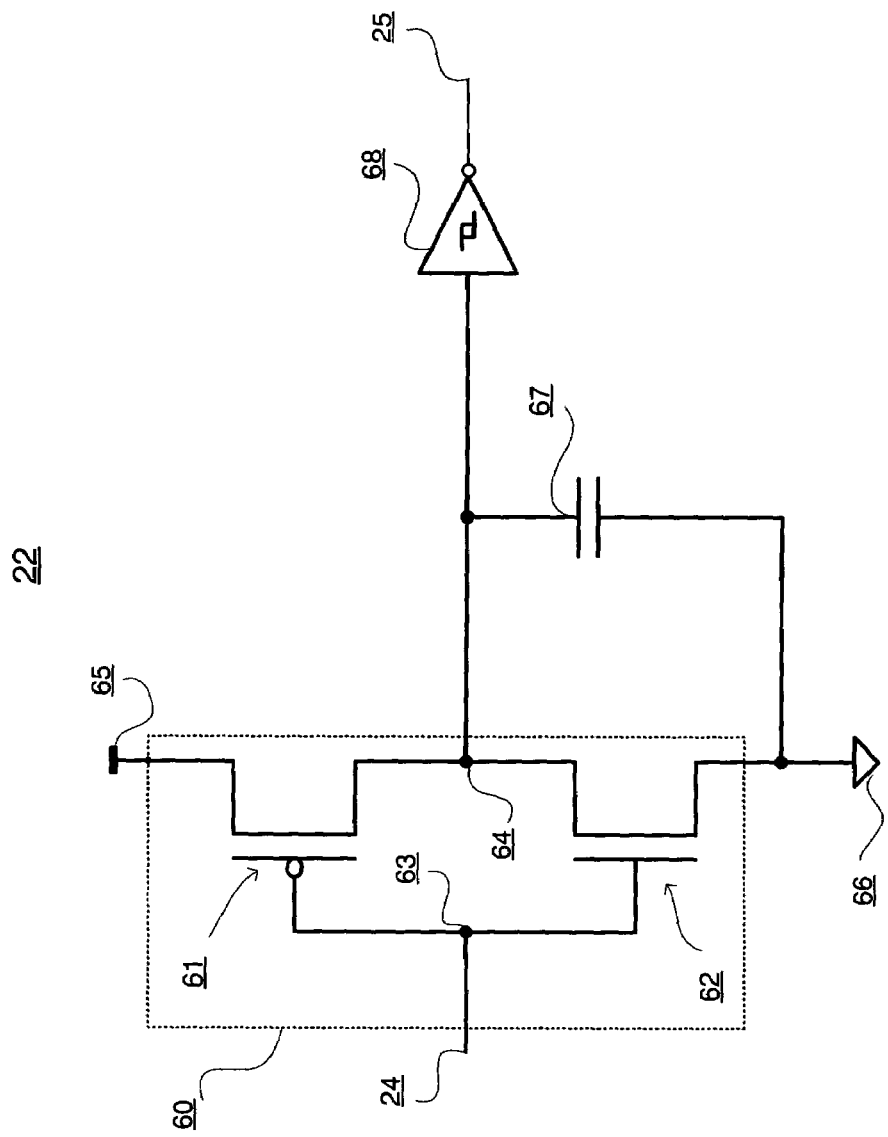
FIG. 6 is a schematic diagram depicting an exemplary embodiment of an asymmetric low-pass filter.

FIG. 6 is a schematic diagram depicting an exemplary embodiment of ALPF 22. Cycle lock signal 24 is provided to input node 63 of inverter 60. Inverter 60 may be formed of a p-type transistor 61 and an n-type transistor 62.

A gate terminal of each of transistors 61 and 62 is coupled to input node 63. A source terminal of transistor 61 is coupled to a supply voltage 65, and a source terminal of transistor 62 is coupled to a return voltage 66. A drain terminal of each of transistors 61 and 62 is coupled to an output node 64 of inverter 60.

A capacitor 67 is coupled to output node 64 and return voltage 66. Supply voltage 65 may be Vdd or Vcc, and return voltage 66 may be ground. An input of a hysteresis device, such as a Schmitt Trigger device 68, is coupled to output node 64. Output of Schmitt Trigger device 68 is lock signal 25. Schmitt Trigger device 68 may be used to mitigate against "snap back" due to a significant amount of jitter obscuring a signal at output node 64.

For cycle lock signal 24 logic high, transistor 61 is in a substantially non-conductive state ("switched off") and transistor 62 is in a substantially conductive state ("switched on"). Accordingly, output node 64 is coupled to return voltage 66 via transistor 62 causing capacitor 67 to discharge. For cycle lock signal 24 logic low, transistor 61 is switched on and transistor 62 is switched off. Accordingly, output node 64 is coupled to supply voltage 65 via transistor 61 causing capacitor 67 to charge. However, the time to charge capacitor 67 is longer than the time to discharge capacitor 67.

Charge and discharge times of capacitor 67 may be configured by sizing of transistors 61 and 62, respectively. For example, a charge time constant for capacitor 67 may be determined from its capacitance and channel impedance of transistor 61, and a discharge time constant for capacitor may be determined from its capacitance and channel impedance of transistor 62. In this embodiment, p-type transistor 61 is formed with a higher channel impedance than channel impedance of n-type transistor 62. By forming transistors 61 and 62 such that respective RC time constants for charging and discharging capacitor 67 are different, namely, where the charge up RC time constant is significantly larger than the discharge RC time constant, false out-of-lock indications due to jitter may be filtered out.

Because capacitor 67 discharges more quickly than it charges, a logic one and a logic zero input via cycle lock signal 24 input to input node 63 are weighted differently at output node 64. For example, it may take approximately ten or more times longer to charge than discharge. Notably, both RC time constants will be significantly longer than a period of input clock signal 31. Therefore, an out-of-lock condition, which is indicated by a logic low via cycle lock signal 24, will need to stay out-of-lock longer to indicate an out-of-lock condition than a lock condition, which is indicated by a logic high via cycle lock signal 24.

Notably, lock signal 25 may be used to determine whether DLL 23 of FIG. 2 is phase locking to input clock signal 31 of FIG. 2. Additionally, if DLL 23 is not locking because there is too much jitter or intrinsic static delay or a combination thereof, lock signal 25 may be used to indicate whether DLL 23 is locking to phase of a reference input. Notably, ALPF 22 gives more weight to signals inside the lock window than outside of the lock window such that lock signal 25 is less likely to indicate a false out-of-lock condition due to jitter. Therefore, though ALPF 22 is a low pass filter, it really just filters logic zero and logic one by assigning different weights to these logic levels.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. A phase lock detection circuit, comprising:
   a synchronization circuit coupled to receive a reference signal and configured to provide a derivative signal;
   the derivative signal being derived from the reference signal;
   a phase lock detector coupled to receive the reference signal and the derivative signal;
   the phase lock detector configured to provide a cycle lock signal;
   the cycle lock signal indicating whether a phase lock exists as between the reference signal and the derivative signal within a lock window for a clock cycle; and
   an asymmetrical low pass filter coupled to receive the cycle lock signal;
   wherein the asymmetrical low pass filter is configured to unequally weight a lock condition relative to an out-of-lock condition indicated, the lock condition and the out-of-lock condition indicated by the cycle lock signal.

2. The phase lock detection circuit, according to claim 1, wherein the asymmetrical low pass filter includes an inverter and a capacitor, the capacitor being connected at an output node of the inverter at one end and coupled to a constant voltage at another end.

3. The phase lock detection circuit, according to claim 2, the inverter including a p-type transistor and an n-type transistor, the p-type transistor and the n-type transistor formed such that charge time of the capacitor is longer than discharge time of the capacitor to provide the unequal weight of the lock condition relative to the out-of-lock condition.

4. The phase lock detection circuit, according to claim 2, wherein the asymmetrical low pass filter includes a hysteresis device having an input port coupled to the output node of the inverter.

5. The phase lock detection circuit, according to claim 1, wherein the synchronization circuit is a delay-locked loop.

6. The phase lock detection circuit, according to claim 5, wherein the phase lock detection circuit is located inside a Field Programmable Gate Array.

7. A phase lock detector, comprising:
   a first delay coupled to receive a reference signal and configured to provide a delayed version of the reference signal;
   a second delay coupled to receive a feedback signal and configured to provide a delayed version of the feedback signal, the feedback signal being a version of the reference signal;
   a first phase detector coupled to receive the feedback signal and the delayed version of the reference signal;
   the first phase detector configured to compare phase of the feedback signal and the delayed version of the reference signal to provide a first phase relation signal;
   a second phase detector coupled to receive the delayed version of the feedback signal and the reference signal;
   the second phase detector configured to compare phase of the delayed version of the feedback signal and the reference signal to provide a second phase relation signal;
   combinational logic coupled to receive the first phase relation signal and the second phase relation signal to provide a lock indicator signal, the lock indicator signal indicating whether the reference signal and the feedback signal are in a lock window;
   a register having a data input coupled to receive the lock indicator signal and a clock input coupled to receive a clocking signal; and
   an inverter coupled to receive the reference signal and provide the clocking signal.

8. The phase lock detector, according to claim 7, wherein the first delay and the second delay are the same.

9. The phase lock detector, according to claim 8, wherein the first delay and the second delay are adjustable delays.

10. The phase lock detector, according to claim 9, wherein the combinational logic is an exclusive OR gate.

11. The phase lock detector, according to claim 7, wherein the first delay and the second delay are different.

12. The phase lock detector, according to claim 7, wherein the phase lock detector is located inside a Field Programmable Gate Array.

13. A method for providing a lock window, comprising:
inputting a feedback signal to a first phase detector and to a first delay;
inputting a reference signal to a second phase detector and to a second delay;
obtaining an output of the first delay for input to the second phase detector to provide a first portion of the lock window;
obtaining an output of the second delay for input to the first phase detector to provide a second portion of the lock window;
combining the first portion and the second portion of the lock window to provide a lock signal indicative of the lock window; and
registering the lock signal with an inverted version of the reference signal.

14. The method, according to claim 13, further comprising filtering the registered lock signal,
wherein the filtering is performed by an asymmetrical low pass filter.

15. The method, according to claim 14, wherein the asymmetrical low pass filter comprises a hysteresis element.

16. An integrated circuit comprising:
a synchronization circuit, the synchronization circuit configured to receive a reference signal and to provide a derivative signal based on the reference signal; and
a phase lock detector, the phase lock detector comprising:
a first delay coupled to receive the reference signal and configured to provide a delayed version of the reference signal;
a second delay coupled to receive the derivative signal and configured to provide a delayed version of the derivative signal;
a first phase detector coupled to receive the derivative signal and the delayed version of the reference signal;
the first phase detector configured to compare phase of the derivative signal and the delayed version of the reference signal to provide a first phase relation signal;
a second phase detector coupled to receive the delayed version of the derivative signal and the reference signal;
the second phase detector configured to compare phase of the delayed version of the derivative signal and the reference signal to provide a second phase relation signal;
combinational logic coupled to receive the first phase relation signal and the second phase relation signal to provide a lock indicator signal, the lock indicator signal indicating whether the reference signal and the feedback signal are in a lock window; and
asymmetrical low pass filter coupled to receive the lock indicator signal, the asymmetrical low pass filter configured to unequally weight a lock condition relative to an out-of-lock condition.

17. The integrated circuit, according to claim 16, wherein the phase lock detector further comprises:
a register coupled to receive the lock indicator signal and a clocking signal;
the clocking signal being at a frequency of the reference signal.

18. The integrated circuit, according to claim 16, wherein the integrated circuit comprises a Field Programmable Gate Array.

19. The integrated circuit, according to claim 18, further comprising an Input/Output Block, wherein the synchronization circuit and the phase lock detector are within the Input/Output Block.

* * * * *